United States Patent [19]
Moriya et al.

[11] Patent Number: 5,494,522
[45] Date of Patent: Feb. 27, 1996

[54] PLASMA PROCESS SYSTEM AND METHOD

[75] Inventors: Shuji Moriya, Yamanashi; Masahiro Ogasawara, Tokyo; Jun Yashiro, Yokohama; Yoshifumi Tahara, Tokyo; Satoru Kawakami, Sagamihara; Susumu Tanaka, Tokyo, all of Japan

[73] Assignee: Tokyo Electron Limited, Tokyo, Japan

[21] Appl. No.: 214,282

[22] Filed: Mar. 17, 1994

[30] Foreign Application Priority Data

| Mar. 17, 1993 | [JP] | Japan | 5-056939 |
| Mar. 27, 1993 | [JP] | Japan | 5-092524 |
| Mar. 29, 1993 | [JP] | Japan | 5-093758 |

[51] Int. Cl.$^6$ .................................................. C23C 16/00
[52] U.S. Cl. .................. 118/719; 156/345; 118/723 R; 118/723 E; 204/298.25; 204/298.35
[58] Field of Search .................................. 156/345, 643; 118/723 E, 723 ER, 723 I, 723 IR, 715, 719, 729; 204/298.25, 298.35

[56] References Cited

U.S. PATENT DOCUMENTS

| 3,603,284 | 9/1971 | Garnache . | |
| 4,657,620 | 4/1987 | Davis | 156/345 |
| 4,659,413 | 4/1987 | Davis | 156/345 |
| 4,842,680 | 6/1989 | Davis et al. | 156/345 X |
| 4,911,597 | 3/1990 | Maydan et al. | 118/729 X |
| 5,147,493 | 10/1993 | Nishimura et al. | 156/345 |
| 5,280,983 | 1/1994 | Maydan | 204/119.1 |

FOREIGN PATENT DOCUMENTS

| 56-84476 | 7/1981 | Japan . |
| 1253238 | 10/1989 | Japan . |

Primary Examiner—R. Bruce Breneman
Assistant Examiner—Joni Y. Chang
Attorney, Agent, or Firm—Oblon, Spivak, McClelland, Maier & Neustadt

[57] ABSTRACT

A plasma process system for producing gas plasma in an air-tight chamber by high frequency power to process a substrate with the gas plasma comprising a lower electrode on which the substrate to be plasma-processed is mounted, an upper electrode arranged above the lower electrode, a plasma generator circuit for generating plasma between the upper and the lower electrode, a power source for supplying high frequency power to the plasma generator circuit, and bias generator for generating negative voltage in the upper or lower electrode when high frequency power is supplied from the power source to the upper or lower electrode, wherein the plasma generator circuit includes transformer for supplying a part of high frequency power, which is supplied from the power source, to the bias generator.

6 Claims, 7 Drawing Sheets

FIG. 12

PLASMA PROCESS SYSTEM AND METHOD

BACKGROUND OF THE INVENTION

1. Field of the Invention

The present invention relates to plasma process system and method suitable for etching, ashing, sputtering and CVD-processing semiconductor wafers.

2. Description of the Related Art

When plasma is generated in an air-tight process chamber to etch the semiconductor wafer in plasma atmosphere thus generated, "voltage of sheath" is a parameter to check etching reaction because it gives great effect to the energy of ions. Fundamentally, it is determined by potential $V_p$ of plasma and negative potential $V_{DC}$ biased to the side of the cathode. It is therefore asked that these potentials $V_p$ and $V_{DC}$ are adjusted to adjust plasma when plasma is to be generated in the process chamber.

Conventionally, an apparatus in which high frequency power is added to one of upper and lower electrodes and the other of them is earthed is used to generate plasma. Another apparatus in which one of two high frequency power sources is connected to the upper electrode and the other is connected to the lower electrode is also used.

In any of these conventional cases, the upper and lower electrodes and the high frequency power source arranged outside the process chamber form a series circuit when the process chamber is regarded as a circuit element.

When plasma voltage is to be adjusted, therefore, it is difficult to independently and freely adjust only $V_{DC}$ in the apparatus in which the high frequency power source is connected only to one of the upper and lower electrodes.

Even in the case where the high frequency power sources are connected to the upper and lower electrodes, adjustment is conducted in a series circuit. The high frequency power sources used, therefore, must has same power and same capacity. This makes the apparatus large in size.

In the case where plasma is generated in the process chamber and the semiconductor wafer is processed in plasma atmosphere thus generated, three main steps are applied to the wafer. They are anisotropic isotropic etching steps and a discharge step. The discharge step is intended to discharge the charged-up electrostatic chuck. The wafer once attracted by the electrostatic chuck, sometimes, is not released from the chuck even when the power source is switched off. This is because load caused from electrostatic polarization causes the electrostatic chuck to still attract the wafer. The discharge step is therefore needed to solve this problem. To carry out the discharge step, however, weak plasma must be generated. The wafer is thus unnecessarily etched and damaged in this case.

On the other hand, there has been desired a system in which all of the anisotropic and isotropic etching steps and the electrostatic chuck discharge step can be conducted only in a process chamber.

Jpn. Pat. Appln. KOKAI Publication No. Sho 56-84476 discloses a method of using high frequency power having a frequency lower than 10 MHz and placing the wafer adjacent to the frequency electrode arranged on the high voltage side (or plasma etching method of the parallel plate type). It further discloses a cathode and anode coupling method by which power source and earthed electrodes are switched over between them.

Jpn. Pat. Appln. KOKAI Publication No. Hei 1-253238 discloses an apparatus in which high frequency voltage can be added from a high frequency power source to both of upper and lower electrodes at the same time and to one of them independently of the other by means of a changeover means.

In these conventional method and apparatus, however, all of the anisotropic and isotropic etching steps and the discharge step cannot be conducted in a process chamber. Every step asks a chamber in these cases. Therefore, they occupy a large space in a clean room. Particularly when matters to be processed become large in size like an 8-inch wafer and an LCD substrate, an extremely large system is needed. In addition, the conventional system has a long wafer carrying passage. This means that their throughputs are low and that they causes so many particles and others to adhere to the wafer.

In order to reduce the amount of particles and others adhering to the wafer, single or plural load lock chambers are located adjacent to the plasma etching chamber. When their internal pressures are to be returned to normal, it usually takes a relatively long time (or about one minute, for example) because nitrogen gas must be gradually introduced into them to prevent particles and others from floating in them. This asks the wafer to be kept waiting for a long time when it is to be carried into and out of them. The throughput is thus made low.

In the conventional magnetron plasma process system, plasma is maldistributed, because of magnetic field, in the process chamber, particularly along the inner circumference of it, even if plasma is made uniform by scanning magnetic field. The rim portion of the wafer is thus charged up, thereby causing age oxide film to be dielectrically broken down at the rim portion of the wafer. The rate of dielectric breakdown reaches about 10% of all products and the productivity of the system is thus made low.

SUMMARY OF THE INVENTION

An object of the present invention is therefore to provide a plasma process system smaller in size and simpler in structure but capable of adjusting negative potential $V_{DC}$ independently of the other.

Another object of the present invention is to provide a plasma process system capable of applying plural different steps to the wafer in a single process chamber and discharging the electrostatic chuck without adding any damage and unnecessary etching to the wafer.

A further object of the present invention is to provide a plasma process system capable of preventing particles from adhering to the wafer while keeping the throughput higher.

A still further object of the present invention is to provide a plasma process system capable of making the rim portion of the wafer not be charged up to prevent gate oxide film from being dielectrically broken down there.

According to an aspect of the present invention, there can be provided a plasma process system for producing gas plasma in an air-tight chamber by high frequency power to process a substrate with the gas plasma comprising a lower electrode on which the substrate to be plasma-processed is mounted; an upper electrode arranged above the lower electrode; a plasma generator circuit for generating gas plasma between the upper electrode and the lower electrode; a power source for supplying high frequency power to the plasma generator circuit; and bias generator means for generating negative voltage in the upper or lower electrode when high frequency power is supplied from the power source to the upper or lower electrode; wherein the plasma generator circuit includes transformer means for supplying a part of high frequency power, which is supplied from the power source, to the bias generator means.

This system includes transformer means for supplying a part of high frequency power supplied from a power source to a bias generator circuit. This means that plasma and bias generator circuits form no series circuit. Therefore, the bias generator circuit can be adjusted, independently of the plasma generator circuit, to adjust negative potential $V_{DC}$.

Further, the transformer means enables a part of high frequency power supplied from the power source to be supplied, as high frequency power, to the bias generator circuit. Therefore, single high frequency power source only is needed.

According to another aspect of the present invention, there can be provided a plasma process method comprising a first step of applying anisotropic etching to a substrate in a chamber by supplying process gas into the chamber and adding high frequency power to a lower electrode, on which the substrate is mounted, through electrostatic chuck means to generate plasma; a second step of applying isotropic etching to the substrate to remove at least etching residues, damaged layer or resist from it by changing process gas to another and adding high frequency power to an upper electrode in the chamber to generate plasma; and a third step of discharging the lower electrode by stopping the supply of power to the electrostatic chuck while changing process gas to non-oxidizing gas and adding high frequency power to the upper electrode to such an extent that allows weak plasma to be generated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The plasma process systems and methods according to some embodiments of the present invention will be described with reference to the accompanying drawings.

Figure 1:
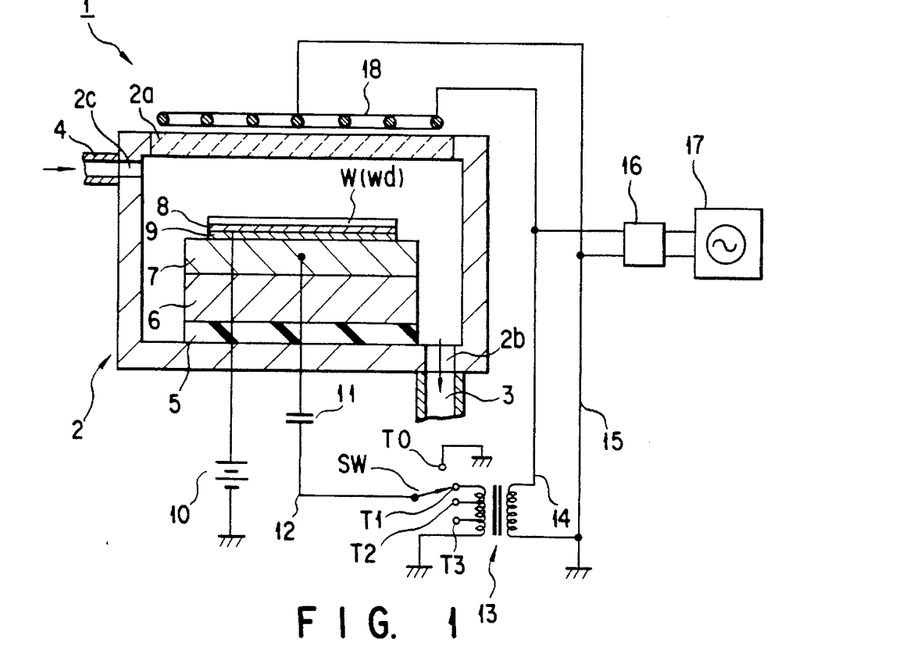
FIG. 1 is a block diagram showing the plasma process system according to a first embodiment of the present invention partly sectioned.

As shown in FIG. 1, the plasma process system 1 according to a first embodiment of the present invention is an etching apparatus having a spiral coil 18 arranged above a process chamber 2. The side wall and bottom of the process chamber 2 are made of aluminium alloy and the top 2a thereof is made of quartz. An exhaust opening 2b is formed in the bottom of the process chamber 2 and it is communicated with exhaust means such as the vaccum pump (not shown) through an exhaust pipe 3.

A gas inlet 2c is formed in the side wall of the process chamber 2 at the upper end portion thereof and it is communicated with a process gas (or etching gas) supply source (not shown) through a gas pipe 4.

A suscepter support 6 is arranged on the center portion of the process chamber 2 with an insulating plate 5 interposed between them. The insulating plate 5 is made of ceramics such as alumina, SiC or SiN. A suscepter 7 is detachably mounted on the top of the suscepter support 6 and it is made of aluminium or aluminium alloy.

A cooling jacket (not shown) is formed in the suscepter support 6 and a coolant is circulated through it. A temperature control unit (not shown) is attached to the suscepter 7 to keep it at a desired temperature which is in a range of $-100°$ C. to $+80°$ C.

An electrostatic chuck 8 on which a wafer w is directly mounted is arranged on the top of the suscepter 7. It comprises a conductive layer 9 made of electrolytic stripping copper, for example, and insulators such as polyimide film for inserting the conductive layer 9 between them. When DC voltage is added from a high voltage DC power source 10 to the conductive layer 9, the wafer W is attracted and held on the top of the electrostatic chuck 8 due to coulomb force.

One end of a lead 12 having a blocking capacitor 11 is connected to the suscepter 7. The other end thereof is connected to a terminal 14 of a changeover switch SW arranged on the secondary circuit of a transformer 13. Plural changeover terminals $T_0$, $T_1$, $T_2$, $T_3$,—(only four changeover terminals $T_0$, $T_1$, $T_2$ and $T_3$, are shown for the sake of clarity in FIG. 1) are provided on the changeover side of the changeover switch SW and power added from the secondary circuit of the transformer 13 to the suscepter 7 can be thus changed by the changeover switch SW.

The changeover terminal $T_0$ serves as an earthed one and the value of voltage supplied through the other terminals is reduced like a step in the order of the terminals $T_1$, $T_2$, $T_3$,—.

Needless to say, the voltage supplied may be changed not like a step but continuously. Power which is in a range of 10%–30% of power supplied through the primary circuit of the transformer 13 can be supplied through the secondary circuit thereof in any case.

On the other hand, power supply and earthed line 14 and 15 are connected to the primary circuit of the transformer 13. Output and earthed sides of a high frequency power source 17 are connected to the power supply and earthed lines 14 and 15 through an impedance matching unit 16. The high frequency power source 17 has a frequency of 13.56 MHz, for example, and it can supply a frequency power of 50 to 1500 W, for example.

The spiral coil 18 is arranged above the quartz-made top 2a of the process chamber 2. Its one end is connected to the power supply lead 14 and its other end to the earthed lead 15.

It will be described how a semiconductor wafer W is etching-processed.

The gate valve (not shown) is opened and a dummy wafer Wd is carried into the process chamber 2 by the carrier unit (not shown). A resist pattern has been formed on the dummy wafer Wd. When this dummy wafer Wd is mounted on the electrostatic chuck 8, DC voltage is added from the high voltage DC power source 10 to the conductive layer 9 of the electrostatic chuck 8. The dummy wafer Wd can be thus held on the electrostatic chuck 8 at a predetermined position.

The gate valve is closed and $CF_4$ gas is introduced into the process chamber 2 through the gas inlet 2c. The process chamber 2 is exhausted to 0.5 Torr. High frequency power, 1000 W and 13.56 MHz, is added from the high frequency power source 17 to the spiral coil 18 through the power supply lead 14. Plasma is thus generated in the process chamber by high frequency induction.

When the changeover switch SW is connected to the terminal $T_1$, voltage which is arranged available through the terminal $T_1$ is added from the secondary circuit of the transformer 13 to the suscepter 7 through the lead 12. Negative potential is thus biased to the suscepter 7. Anisotropic etching, therefore, is applied to the dummy wafer Wd on the electrostatic chuck 8.

After anisotropic etching is applied to the dummy wafer Wd in this manner, the dummy wafer Wd is checked. If any defect is found about the dummy wafer Wd because of insufficient plasma, for example, the terminal connected to the changeover switch SW is changed over to another one to adjust voltage added to the suscepter 7. When voltage added is adjusted in this manner, negative potential $V_{DC}$ biased to the suscepter 7 can be adjusted. On the other hand, the adjustment of power added to the spiral coil 18 can be attained by directly adjusting the high frequency power source 17. After the plasma generating condition is adjusted like this, using the dummy wafer Wd, semiconductor wafers W to be processed are successively processed one after another in the process chamber 2.

As apparent from the above, the power itself of plasma generated in the process chamber 2 and negative potential $V_{DC}$ biased to the anode can be adjusted independently of the other by adjusting the high frequency power source 17 and by changing the terminal of the changeover switch SW arranged on the secondary circuit of the transformer 13.

In this case, the supply of high frequency power can be attained only through the high frequency power source 17. In addition, the transformer 13 may have a capacity enough to supply power equal to about 10% to 30% of power supplied from the high frequency power source 17. The transformer 13 itself can be thus made more compact.

When the changeover switch SW is connected to the earthed terminal $T_0$, no voltage is added from the transformer 13 to the suscepter 7. Isotropic etching can be thus made possible. This means that different etching processes can be achieved in the single process chamber 2.

If inactive gas is introduced into the process chamber 2 and weak plasma is generated in it after the finish of isotropic or anisotropic etching, load remaining on the wafer thus isotropically or anisotropically etched can be discharged. In addition to anisotropic and isotropic etchings, therefore, the discharging of the electrostatic chuck can be attained in the common process chamber 2.

Figure 2:
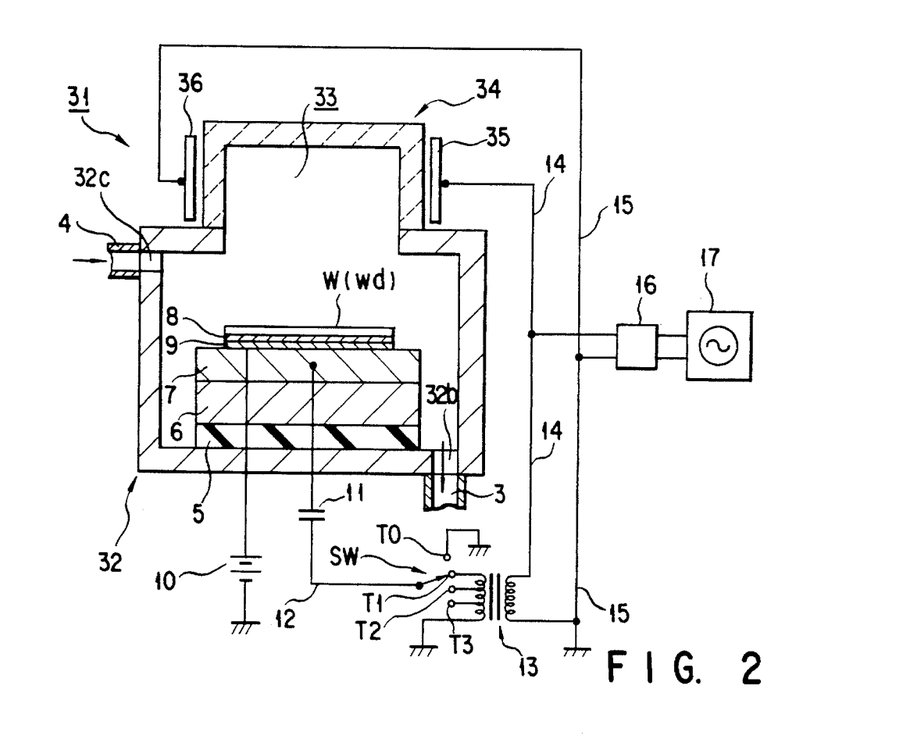
FIG. 2 is a block diagram showing the plasma process system according to a second embodiment of the present invention partly sectioned.

A second embodiment of the present invention will be described referring to FIG. 2. Same components as those of the first embodiment will be described on when needed.

The circuit of a plasma process system 31 according to the second embodiment of the present invention is substantially same as that of the above-described first embodiment. The plasma process system 31 is different from the system 1 only in an upper space 33 in the process chamber, and upper electrodes 35 and 36. These space 33 and upper electrodes 35 and 36 cooperate with the lower electrode (or suscepter) 7 to form a circuit of plasma generator.

A cap 34 is arranged on the top of a chamber 32 to form the upper space 33 in the chamber 32. It is made of quartz. The upper electrode 35 is arranged outside a side wall of it while the other upper electrode 36 outside an opposed side wall of it. They are therefore parallel plate electrodes with the cap 34 interposed between them. One 35 of them is connected to the power supply lead 14 and the other 36 to the earthed lead 15. A gas inlet 32c is formed just below the upper space 33.

Then wafer W will be etched as follows by the plasma process system 31.

While exhausting the chamber 32, $CF_4$ gas is supplied into it through the gas inlet 32c and it is adjusted to about 0.1 Torr. When high frequency power, 1000 W and 13.56 MHz, is added to the electrode 35, plasma is generated in the upper space 33.

When the change over switch SW is connected not to the terminal $T_0$ but to any of the terminals $T_1$, $T_2$ and $T_3$, negative voltage is biased to the suscepter 7 and anisotropic etching is thus applied to a dummy wafer Wd on the electrostatic chuck 8. The dummy wafer Wd thus etched is checked. If it has any defects, the changeover switch SW is changed over to another terminal to adjust voltage biased to the suscepter 7. The state of plasma can be thus made suitable for the etching process. When the high frequency power source 17 is adjusted, the power of plasma can also be changed.

According to the second plasma process system 31, the supply of high frequency power can be attained only through the single power source 17. In addition, the transformer may have a capacity enough to supply power equal to about 10% to 30% of power supplied from the high frequency power source 17. This makes the whole of the system smaller-sized.

When the changeover switch SW is connected to the terminal $T_0$, isotropic etching can be applied to the wafer W. When weak plasma is generated in the process chamber 32, load remaining on the wafer w thus etched can be discharged. In short, the system 31 enables three different processes such as anisotropic and isotropic etchings and load discharge to be achieved in the single process chamber 32.

A pair of one turn coil antennas may be used as plasma generator means instead of the parallel plate electrodes 35 and 36. Helicon wave plasma generator of the high frequency induction type can be provided in this case.

Figure 3:
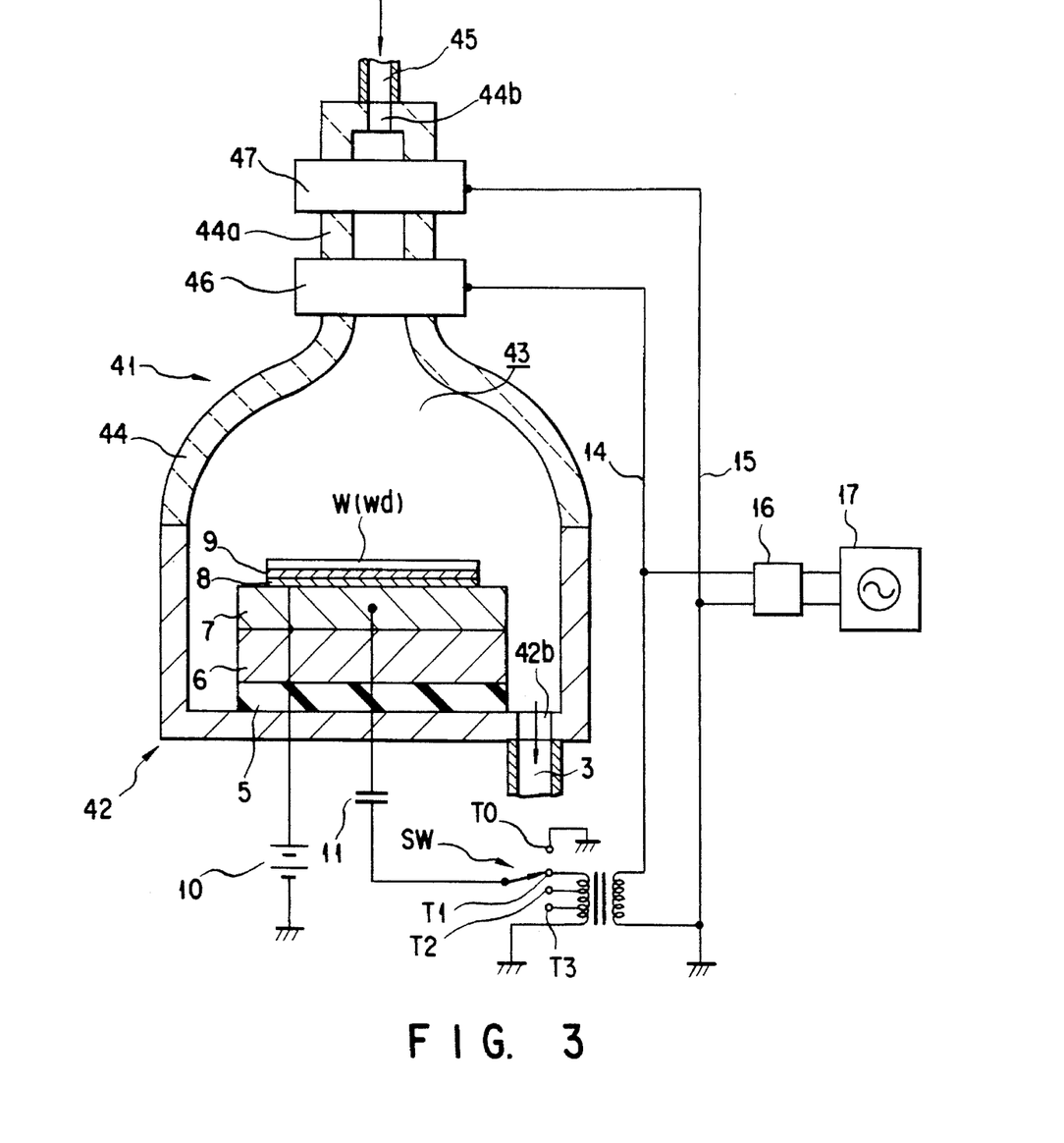
FIG. 3 is a block diagram showing the plasma process system according to a third embodiment of the present invention partly sectioned.

A plasma process system 41 according to the third embodiment of the present invention will be described referring to FIG. 3. Same components as those of the first and second embodiments will be described only when needed.

The circuit of this third plasma process system 41 is substantially same as those of the first and second embodiments. A chamber 42 comprises lower and upper halves. The lower half of the chamber 42 is made of aluminium alloy and the upper half 44 thereof of quartz. A top cylindrical portion 44a of the upper half 44 has a diameter smaller than that of the lower half. This cylindrical portion 44a forms therein a space 43 in which plasma is generated.

A gas inlet 44b is formed in the top of the cylindrical portion 44a and $CF_4$ gas is introduced into the chamber 42 through the gas inlet 44b. A pair of ring electrodes 46 and 47 are attached to the outer circumference of the cylindrical portion 44a. They are separated from each other in the vertical direction and the power supply lead 14 is connected to the lower one 46 while the earthed lead 15 to the upper one 47.

The wafer W will be etched as follows by the third plasma process system 41.

while exhausting the chamber 42 to 0.1 Torr, $CF_4$ gas is introduced into it through the gas inlet 44b. When high frequency power, 1000 W and 13.56 MHz, is added to the lower ring electrode 46, gas is made plasma in the cylindrical portion 44a. This plasma gas flows, as down flow, from the upper space 43 onto the wafer W below. The wafer W is thus etched.

According to the plasma process system 41, the supply of high frequency power can be attained only through the high frequency power source 17. In addition, the transformer may have a capacity enough to supply power equal to about 10% to 30% of power supplied from the power source 17. Therefore, the whole of the system 41 can be smaller-sized.

A plasma process system 51 according to the fourth embodiment of the present invention will be described with reference to FIG. 4. Same components as those of the first through third embodiments will be described only when needed.

The chamber 51 is a sealed container made of aluminium alloy and it is earthed. A suscepter support 53 is arranged on its floor with an insulating plate 52 interposed between them. A cooling jacket 54 is formed in the suscepter support 53. Coolant introducing and exhausting pipes 55 and 56 are communicated with the cooling jacket 54. Coolant is introduced from a coolant supply source (not shown) into the jacket 54 through the coolant introducing pipe 55 and exhausted from it through the coolant exhausting pipe 56.

A suscepter 57 made of aluminium alloy is detachably attached to the top of the suscepter support 53. An electrostatic chuck 58 is mounted on the top of the suscepter 57.

Gas passages 60 are formed in the suscepter 57, communicating with a gas introducing pipe 59. When He gas is supplied from a gas supply unit (not shown) into the gas passages 60 through the gas introducing pipe 59, heat is exchanged between the suscepter support 53 and the wafer W by introduced He gas. The wafer W on the electrostatic chuck 58 can be thus cooled.

The electrostatic chuck 58 comprises a conductive layer 61 and polyimide film layers between which the conductive layer 61 is interposed. The conductive layer 61 is connected to a high voltage DC power source 63 through a supply lead 62. When DC voltage is added to the conductive layer 61, the wafer W is attracted onto the electrostatic chuck 58 due to coulomb force. This addition of DC voltage from the power source 63 is made by turning a switch $SW_1$ on and off.

An insulating focus ring 64 is arranged on the top of the suscepter 57 and along the peripheral portion thereof, enclosing the wafer W on the electrostatic chuck 58. This focus ring 64 enables reactive ions, which have been made plasma, to effectively act on the wafer W.

One end of a lead 65 is connected to the suscepter 57 and the other end thereof to a terminal 66 on the lower electrode side of an electrode changeover switch $Sw_2$.

An upper shower electrode 71 has a plurality apertures 72 in the bottom thereof. It is electrically insulated from the chamber 51 and at least its face 72a which is opposed to the suscepter 57 is made of amorphous carbon or silicon.

The upper electrode 71 is made hollow and three gas supply sources 83, 84 and 85 are communicated with the hollow portion in the upper electrode 71 through a valve 76 and pipes 77 to 80. The valve 76 is arranged in a top gas inlet 73 of the upper electrode 71. The main pipe 77 is divided into three pipes 78, 79 and 80. The first branching pipe 78 is communicated with the first gas supply source 83 via a valve 81 and a mass flow controller (MFC) 82. The second branching pipe 79 is communicated with the second gas supply source 84 via a valve 81 and an MFC 82. The third branching pipe 80 is communicated with the third gas supply source 85 via a valve 81 and an MFC 82. The first gas supply source 83 contains $CF_4$ gas therein, the second one 84 oxygen gas therein, and the third one 85 argon gas therein.

One end of a connecting lead 74 is connected to the upper electrode 71. This lead 74 is insulated from the process chamber 51. The other end of the lead 74 is connected to a terminal 75 on the upper electrode side of the changeover switch $SW_2$.

An exhaust opening 91 is formed in the bottom of the process chamber 51. It is communicated with a vacuum pump 93 via a valve 92 and an exhaust pipe 94.

The electrode changeover system of this example will be described below.

The changeover of polarities is made by the electrode changeover switch $WS_2$. This switch $SW_2$ has the upper and lower electrode terminals 75 and 66. It is also provided with terminals on earthed and power source sides which are switched on and off to the terminals 75 and 66 on the upper and lower electrode sides.

More specifically, earthed and power source terminals 101 and 102 are switched on and off to the upper electrode side terminal 75 while power source and earthed terminals 103 and 104 to the lower electrode side terminal 66. The power source terminals 102 and 103 are connected to their corresponding matching units 105 and 106, which are further connected to a high frequency power source 108, which can change its output, through a blocking capacitor 107.

The control system of this example will be described below.

The valves 76, 81, 92, MFCs 82, vacuum pump 93, DC power source switch $SW_1$, electrode changeover switch $WS_2$ and high frequency power source 107 are controlled by a controller 111. This controller 111 has three operation modes, that is, RIE (reactive ion etching), PE (plasma etching) and discharge modes, and it controls the above-mentioned components responsive to the mode switched. The RIE mode is intended to add RF power to the suscepter 57. The PE mode is intended to add RF power to the upper electrode 71. The discharge mode is intended to generate weak plasma under the PE mode to discharge the charged surface of the electrostatic chuck 58 through the impedance of this plasma.

It will be described how a wafer W is etched.

The controller 111 is set to carry out the RIE mode. The semiconductor wafer W on which a resist pattern has been formed is mounted on the electrostatic chuck 58. When the valves 76 and 81 are opened and $CF_4$ gas is supplied to the upper electrode 71, gas is uniformly discharged onto the wafer w through the apertures 72 of the upper electrode 71. The process chamber 51 is kept about 0.5 Torr.

In the section of the electrode changeover switch $Sw_2$, the controller 111 keeps the upper electrode side terminal 75 connected to the earthed terminal 101 and the lower electrode side terminal 66 connected to the power source terminal 103. When the power source 108 is switched on, high frequency power, 1 kw and 13.56 MHz, set by the controller 111 is added to the lower electrode 57. Anisotropic etching is thus applied to the wafer W under the RIE mode.

when anisotropic etching is finished, the controller 111 is set to carry out the PE mode. The high frequency power source 57 is switched off and $CF_4$ gas remaining in the process chamber 51 is then exhausted outside through the exhaust opening 91. The controller 111 causes $O_2$ gas to be supplied from the $O_2$ gas bomb 84 into the process chamber 51, which is kept about 1 Torr.

Figure 4:
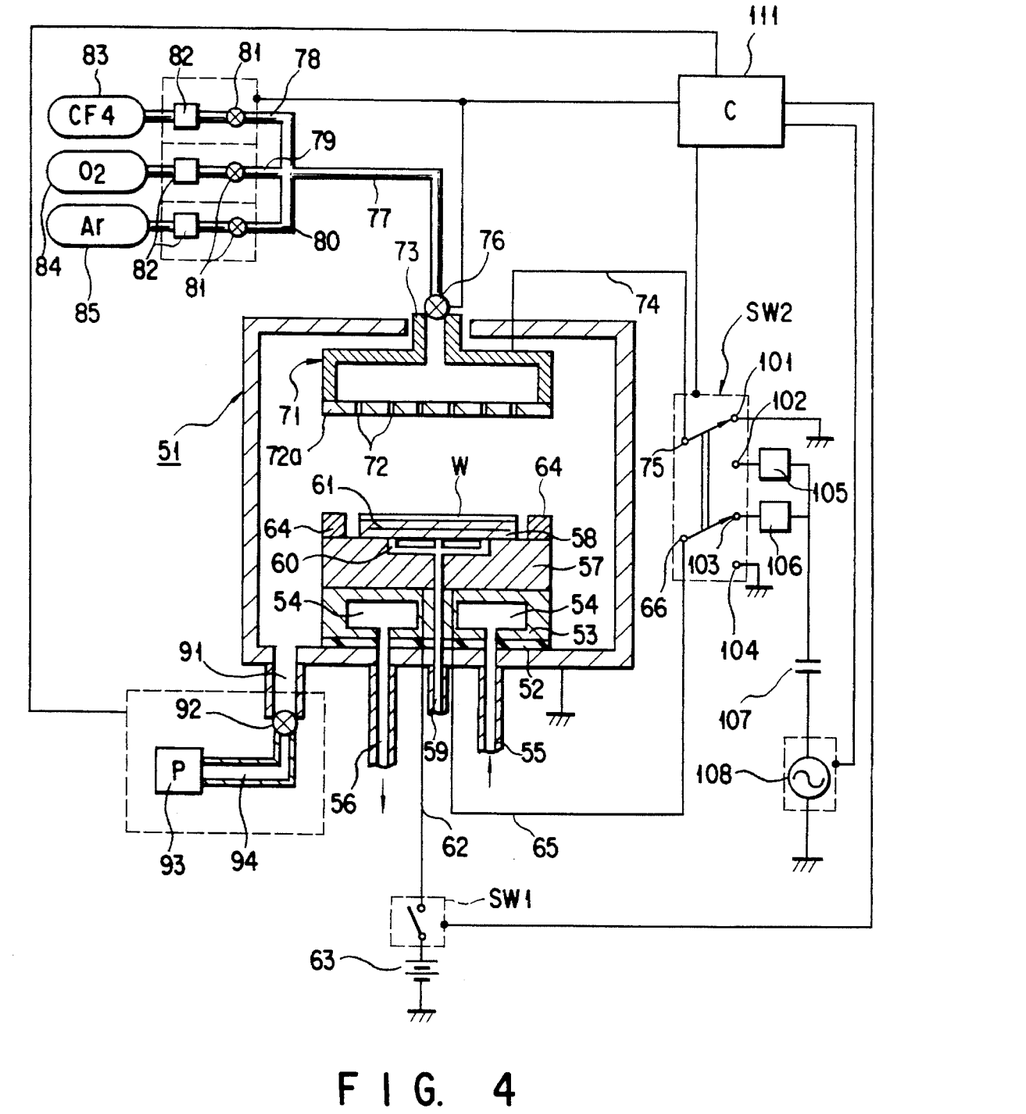
FIG. 4 is a block diagram showing the plasma process system according to a forth embodiment of the present invention partly sectioned.

In the section of the electrode changeover switch $Sw_2$, the controller 111 keeps the upper electrode side terminal 75 connected to the power source terminal 102 and the lower electrode side terminal 66 connected to the earthed terminal 104 (which is reverse to the state shown in FIG. 4). When the power source 108 is switched on, high frequency voltage which is set to have a power value of 400 to 800 W by the controller 111 is added to the upper electrode 71. Isotropic etching is thus applied to the wafer w to remove etching residues, damaged layer and resist film from it.

When isotropic etching is finished, the controller 111 is set to carry out the discharge mode. The high frequency power source 108 is switched off and $O_2$ gas remaining in the process chamber 51 is then exhaust outside through the exhaust opening 91. The controller 111 causes Ar gas to be supplied from the Ar gas bomb 85 into the process chamber 51, which is kept about 2 Torr. The switch $SW_1$ is turned off to stop the supply of DC voltage from the high frequency DC power source 63 to the electrostatic chuck 58.

On the other hand, the electrode changeover switch $Sw_2$ is kept same as under the PE mode. When the high frequency power source 107 is switched on, high frequency power, 80 W, set by the controller 11 is added to the upper electrode 71. Weak plasma of inactive gas is thus generated. Load remaining on the electrostatic chuck 58 is discharged through this weak plasma of inactive gas. The electrostatic chuck 58 (or charged-up surface thereof) can be thus discharged.

When the electrostatic chuck 58 is discharged in this manner, the high frequency power source 108 is switched off and Ar gas remaining in the process chamber 51 is exhausted outside. A new wafer W is exchanged with the processed one and the controller 111 is again set to carry out the RIE mode. The new wafer W can be thus processed in the same way as described above.

According to the fourth embodiment of the present invention, three different processes such as the isotropic and anisotropic etching and discharge ones can be applied to a sheet of the semiconductor wafer in a same process chamber. The whole of the system can be thus smaller-sized. In addition, the time needed to process the wafer can be shortened and the throughput can be enhanced. Further, the productivity can be increased because the amount of particles adhering to the wafer W can be reduced to a greater extent.

Those related components such as the carrier units and the auxiliary vacuum chambers may be controlled by the controller 111 in addition to the above-mentioned ones.

The modes which are carried out by the controller 111 are not limited to the above-mentioned three ones. The controller 111 can also be set to carry out those modes which meet the kinds and steps of processes employed. In addition, control modes can be set relative to those various process apparatuses such as CVD, ashing and sputtering ones, for example, in each of which various different treatments are applied to the matter to be processed.

Even in the case of the above-described controller which has only three modes, it can be arranged that anisotropic and isotropic etching processes are repeated after they are once conducted and that discharge process is then conducted. It can also be arranged that anisotropic etching process is carried out after isotropic etching process and that discharge process is then carried out.

In any cases, these processes can be realized only by changing the controller program a little while leaving the mechanical and electrical components of the system itself unchanged.

In the above-described plasma process system, plasma and bias generator mean do not form a series circuit. Therefore, the power of plasma and negative potential $V_{DC}$ biased to the cathode can be adjusted independently of the other.

In addition, power supplied to the bias generator means is a part of that power which is supplied from the high frequency power supply means through the transformer means. This enables only the high frequency power source to be used.

Further, power added to the cathode may be equal to 10% to 30% of that power which is added to the plasma generator means. The rated capacity of the transformer means can be thus made smaller and the whole of the system can be made more compact.

A fifth embodiment of the present invention will be described referring to FIGS. 5 through 9.

Figure 5:
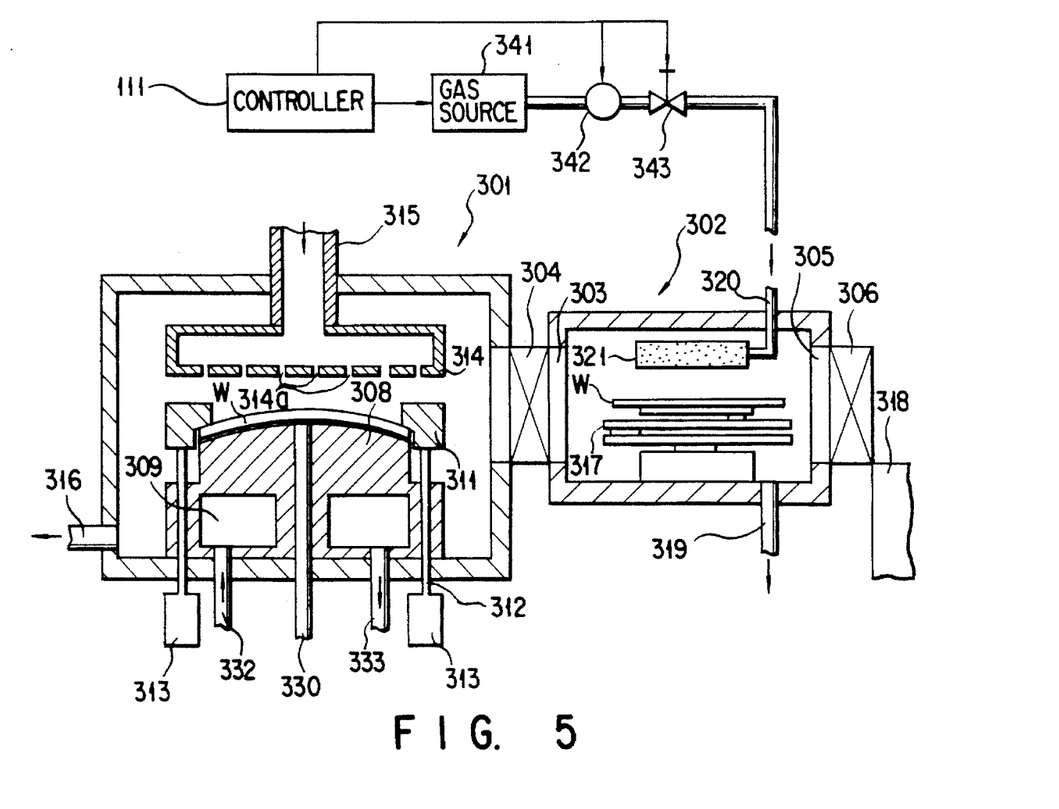
FIG. 5 is a block diagram showing process and load lock chambers of the plasma process system according to a fifth embodiment of the present invention partly sectioned.

As shown in FIG. 5, this plasma process system includes etching and load lock chambers 301 and 302. A gate valve 304 is arranged between the etching 301 and the load lock chamber 302 to shield a wafer carrying passage 303. When the gate valve 304 is opened, both of the chambers 301 and 302 are communicated with each other through the wafer carrying passage 303. The etching chamber 301 is a cylindrical housing made of aluminium alloy. The load lock chamber 302 is a housing like a rectangular parallel-epiped made of aluminium alloy. The volume of the load lock chamber 302 is smaller than that of the etching chamber 301. The load lock chamber 302 for a 6-inch wafer, for example, has a volume of about 10 liters. It has an opening 305 through which the wafer W is carried from outside into it. A gate valve 306 is attached to the opening 305. An autoloader 318 is located outside and adjacent to the gate valve 306.

A lower electrode 308 is arranged in the etching chamber 301. The wafer W is mounted on the lower electrode 308. A coolant circulating passage 309 through which helium gas is circulated is formed in the lower electrode 308. Pipes 332 and 333 are connected to the coolant circulating passage 309. Coolant is circulated through these passage 309 and pipes 332, 333 to cool the wafer W on the lower electrode 308.

A clamp ring 311 is supported by plural rods 312 and moved up and down by cylinders 313. When it is moved down, it pushes the rim portion of the wafer W against the lower electrode 308.

Further, an upper electrode 314 is arranged above the lower one 308. It is opposed to and separated from the lower electrode 308. It has a plurality of apertures 314a in its bottom. These apertures 314a are distributed in the bottom of the upper electrode 314 at a certain pitch interval. A gas supply pipe 315 is connected to the top of the upper electrode 314 to supply process gas from a gas supply source (not shown) into the etching chamber 301 through it. An exhaust pipe 316 extends from the lower portion of the side wall of the etching chamber 301.

A carrier unit 317 is arranged in the auxiliary vacuum chamber 302 and the wafer W is carried between the carrier unit 317 and the auto-loader 318. An exhaust pipe 319 is connected to the bottom of the auxiliary vacuum chamber 302. The chamber 302 is thus exhausted through the pipe 319. A gas nozzle 321 is arranged above the carrier unit 317 in the auxiliary vacuum chamber 302. It is communicated with a gas supply source 341 through a pipe 320. A regulator 342 and a valve 343 are attached to the pipe 320. These gas supply source 341, regulator 342 and valve 343 are controlled by a controller 111.

Figure 6:
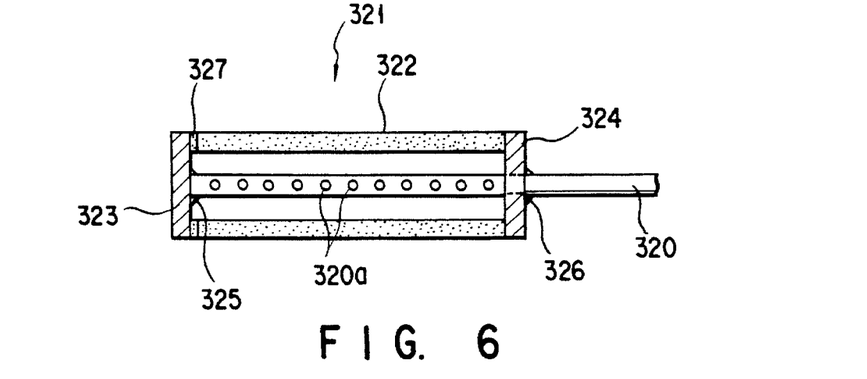
FIG. 6 is a vertically-sectioned view showing a gas nozzle in the load lock chamber.

The gas nozzle 321 and its making manner will be described, referring to FIG. 6.

The gas nozzle 321 comprises a cylindrical porous body 322, a pair of end plates 323 and 324 fixed to both ends of the body 322, and a seal member interposed between one end of the porous body 322 and the end plate 323. The front end portion of the pipe 320 is inserted into the gas nozzle 321 along the longitudinal center line thereof and it has one or two lines of apertures 320 which are arranged at an equal pitch interval. The seal member 327 is made of flexible material. The pipe 320 and the end plates 323, 324 are made of stainless steel and the pipe 320 is fixed to the end plates 323 and 324 at welding points 325 and 326.

It is desirable that ceramics sinter such as alumina, silicon nitride and silicon carbide or metal sinter such as aluminium alloy is used as the porous body 322. The average diameter of pores in the porous body 322 is 0.2 µm and the rate of pores per the porous body 322 is 10% to 50%. The gas nozzle 321 has a length of about 100 mm and its diameter is 30 mm to 100 mm. The porous body 322 may be variously shaped like a cylinder and a disk.

The gas nozzle 321 is made as follows. The front end portion of the pipe 320 is loosely passed through hole of one end plate 324 and the front end thereof is welded and fixed to the other end plate 323. The seal member 327 is inserted between the end plate 323 and the porous body 322 and the pipe 320 is welded and fixed to the end plate 324 while pushing the porous body 322 against the end plate 323 by means of the end plate 324.

It will be described how the above-described etching process system is operated. The following component operations are controlled by the controller 111.

The gate valve 304 is previously closed to shield the etching chamber 301 from the auxiliary vacuum one 302. The vacuum process chamber 301 is exhausted under this state through the exhaust pipe 316. It is thus set $10^{-6}$ Torr.

The gate valve 306 of the auxiliary vacuum chamber 302 which is under normal pressure is opened and the carrier unit 317 is extended to the auto-loader 318 through the opening 305 to carry the wafer W from the auto-loader 318 into the auxiliary vacuum chamber 302.

The gate valve 306 is closed and the auxiliary vacuum chamber 302 is exhausted vacuum through the exhaust pipe 319. The gate valve 304 is opened to communicate the vacuum process chamber 301 with the auxiliary vacuum one 302. The arm of the carrier unit 317 is extended to mount the wafer W on the lower electrode 308. The clamp ring 311 pushes the wafer W against the lower electrode 308. The arm of the carrier unit 317 is retreated from the chamber 301 and the gate valve 304 is closed.

Etching gas is blown out onto the wafer W through the apertures of the upper electrode 314 while exhausting the chamber 301. High frequency voltage is added between the upper 314 and the lower electrode 308. The wafer W is thus etched by gas plasma. At the same time, coolant is circulated through the passage 309 and the pipe 310 to cool the wafer W.

When the etching of the wafer W is finished, the gate valve 304 is opened and the wafer w is carried into the auxiliary vacuum chamber 302 by the carrier unit 317. The gate valve 304 is closed and nitrogen gas is supplied into the auxiliary vacuum chamber 302 through the gas nozzle 321 to return the chamber 302 to normal pressure. Gas is uniformly jetted out this time from the outer circumference of the porous body 322 through the pores thereof. Therefore, a desired flow rate of gas can be obtained and the velocity of gas flow can be kept low. The auxiliary vacuum chamber 302 can be thus returned to be under normal pressure for a shorter time while reducing the number of floating particles to a greater extent. The gate valve 306 is then opened and the wafer W is carried out of the auxiliary vacuum chamber 302.

Figure 7:
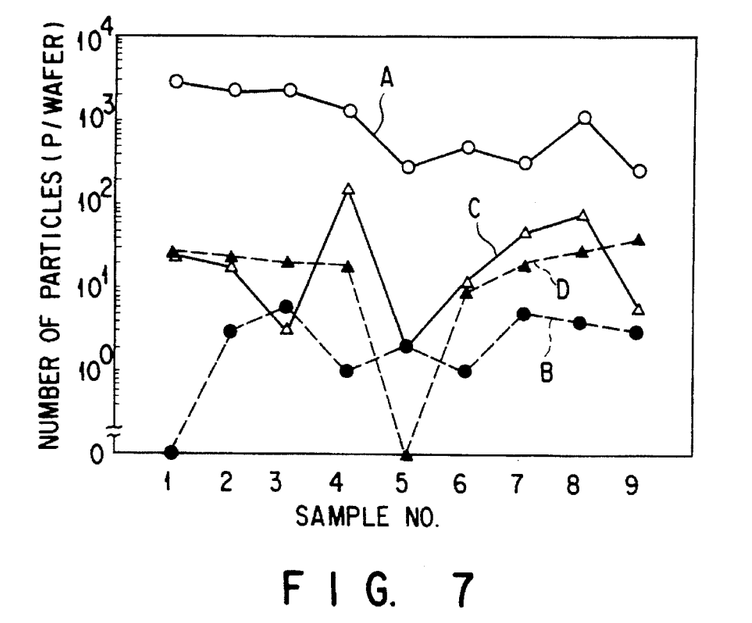
FIG. 7 is a graph showing results obtained relating to the number of particles adhering to each sample wafer.

FIG. 7 is a graph in which sample numbers 1 to 9 are plotted on the horizontal axis and numbers of particles having a size larger than 0.2 mm and adhering to the 6-inch wafer W are plotted on the vertical axis, and in which our examples are compared with a comparison one. The vertical axis of the graph serves as a logarithmic scale. In the graph, a curve A denotes results obtained by the comparison example and curves B, C and D those obtained by our examples. Further, the curve A represents results obtained when gas was introduced into the auxiliary vacuum chamber 302 through an opening in the side wall of the chamber 302. The curve B denotes results obtained when a cylindrical gas nozzle made of ceramics and having a length of 100 mm was used. The curve C represents results obtained when a column-like gas nozzle made of stainless steel sinter and having a length of 75 mm was used. The curve D represents results obtained when a disk-like gas nozzle made of stainless steel sinter and having a diameter of 150 mm was used.

Particles each having a size larger than 0.2 mm were counted. The number of particles was counted before the wafer W was carried into the auxiliary vacuum chamber 302, and the number of particles was also counted after the wafer W was carried out of the chamber 302. The difference of the former relative to the latter was calculated. When the wafer W was carried into the auxiliary vacuum chamber 302 in the latter case, the chamber 302 was exhausted and again returned to normal pressure. The time needed to return the chamber 302 from its being decompressed to a predetermined value to its being kept under normal pressure was set to be 30 seconds.

As apparent from the graph in FIG. 7, about 1000 particles adhered to the wafer W in the comparison example (curve A). Particles adhered to the wafer W were reduced to several and several tens in our examples (curves B, C and D). The number of particles adhered was the smallest in our example represented by the curve B (the disk-like gas nozzle made of ceramics and having a length of 100 mm was used in this case).

Figure 8:
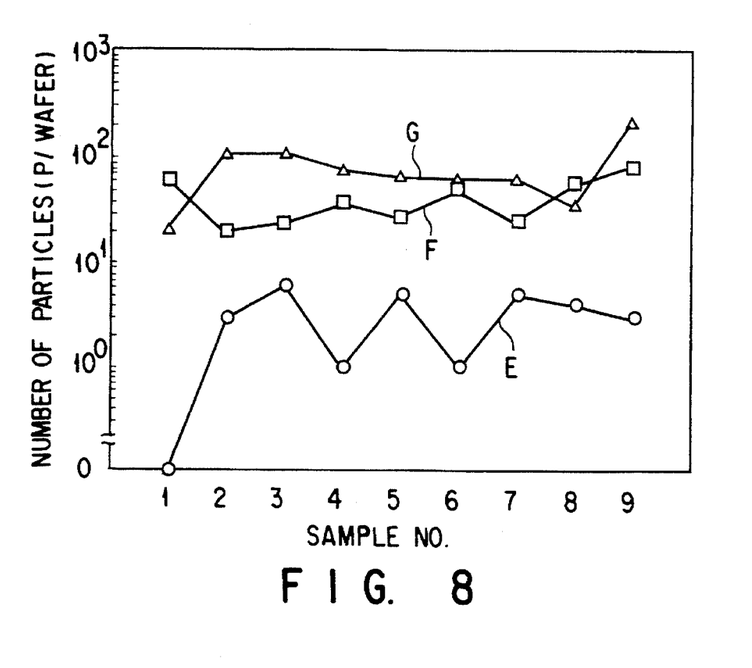
FIG. 8 is a graph showing results obtained relating to the number of particles adhering to each sample wafer.
Figure 9:
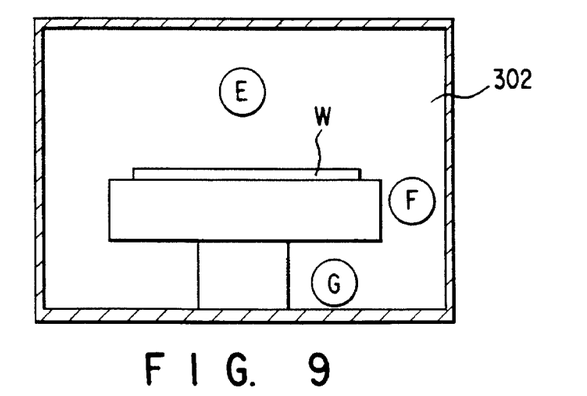
FIG. 9 is a view showing those positions in the load lock chamber at which the gas nozzle is set.

FIG. 8 is a graph in which sample numbers 1 to 9 were plotted on the horizontal axis and numbers of particles adhering to the 6-inch wafer W and having a size larger than 0.2 µm were plotted on the vertical axis to check how the position of the gas nozzle in the chamber 302 was related to the number of particles adhering to the wafer W. The gas nozzle 321 was arranged at each of those positions in the chamber 302 which were denoted by capital letters E, F and G in FIG. 9. The gas nozzle used in these examples was the column-like one made of ceramics and having a length of 100 mm.

A curve E represents results obtained when the gas nozzle 321 was positioned above the wafer W. A curve F represents results obtained when it was positioned by the wafer W. A curve G denotes results obtained when it was positioned below the wafer W.

As apparent from the graph shown in FIG. 8, the curve E is more excellent than the curves F and G. It is therefore most preferable that the gas nozzle is positioned above the wafer w. The curve E shows that the number of particles adhering to the wafer W can be reduced to about three, that is, it can be reduced to the greatest extent.

The reason is imagined to be as follows. When the gas nozzle is positioned above the wafer W, gas running out of the gas nozzle 321 forms such a flow that collides with the wafer W at first and then advances to the bottom of the auxiliary vacuum chamber 302. Even if particles float in the chamber 302, therefore, this flow of gas prevents them from adhering to the wafer w. In a case where the gas nozzle cannot be positioned above the wafer W from the view-point of design, however, it may be positioned by or below the wafer W. The number of particles adhering to the wafer W can be reduced to a tenth or less even in this case, as compared with the conventional cases.

A sixth embodiment of the present invention will be described with reference to FIGS. 10 through 12. Same components as those of the above-described embodiments will be described only when needed.

Figure 10:
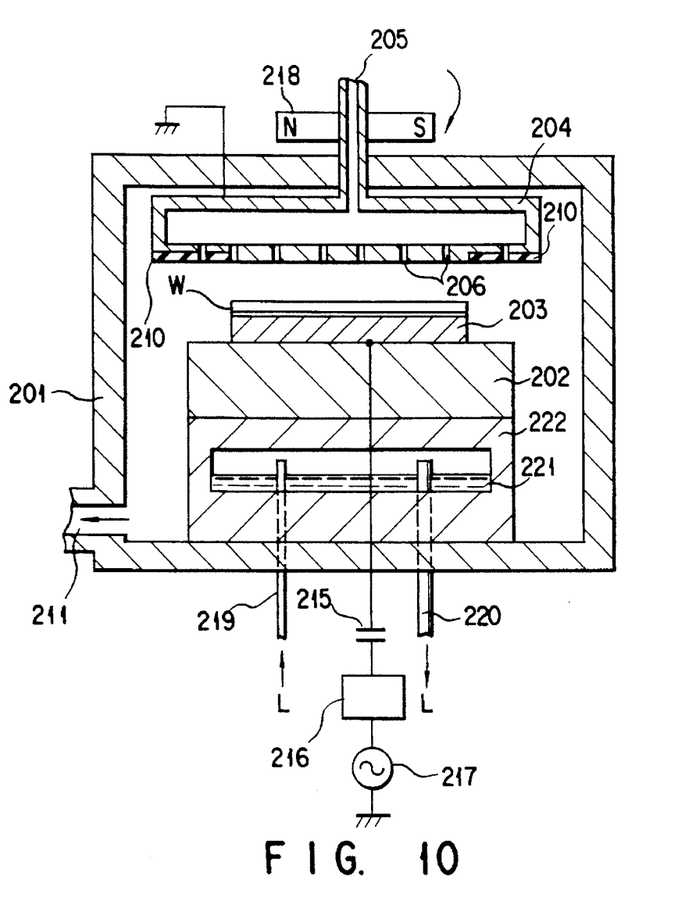
FIG. 10 is a vertically-sectioned view showing the plasma process system according to a sixth embodiment of the present invention.

As shown in FIG. 10, upper and lower electrodes 204 and 202 are arranged in a chamber 201. The upper electrode 204 is earthed and the lower one 202 is connected to a high frequency power source 217 via a capacitor 215 and a matching circuit 216. An electrostatic chuck 203 is mounted on the lower electrode 202. The chamber 201 and the upper and lower electrodes 202 and 204 are made of conductive material such as aluminium alloy and coated with alumite of about 50 mm.

A permanent magnet 218 is rotatably arranged above the upper electrode 204. When the magnet 218 is rotated, rotating magnetic field is generated between the upper 202 and the lower electrode 204. A cooling jacket 222 is arranged under the lower electrode 202. Coolant supply and discharge pipes 219 and 220 of the cooling jacket 222 are communicated with a coolant supply unit (not shown) to supply and discharge nitrogen liquid 221 into and from the cooling jacket 222.

The upper electrode 204 is made hollow and this hollow portion in the upper electrode 204 is communicated a process gas supply source (not shown) through gas supply opening 205. A plurality of apertures 206 are formed in the bottom of the upper electrode 204 and when gas is supplied to the hollow electrode 204, it is jetted into the chamber 201 through the apertures 206. An exhaust opening 211 is formed in the lower end portion of a side wall of the chamber 201, which is exhausted through the exhaust opening 211.

The rim portion of the underside of the upper electrode 204 is coated with an insulator 210. In short, the insulator 210 covers, like a ring, the underside of the upper electrode 204 along the rim thereof while leaving the center portion thereof uncovered. This insulator 210 is intended to relax the strength of magnetic field when plasma is generated, thereby reducing the charging-up of the wafer W at the rim portion thereof.

The insulator 210 has an outer diameter substantially equal to that of the upper electrode 204 and an inner diameter substantially equal to the outer diameter of the wafer W. It is preferable in the case of the 6-inch wafer that the ring-shaped insulator 210 has an inner diameter of about 110 to 150 mm and a thickness larger than 1 mm, although not particularly limited. The insulator 210 may be made of organic or inorganic material. When organic material is used, the polyimide system resin or polyfluoroethylene system resin is preferable. When inorganic material is used, quartz or ceramics is preferable.

It will be described how the wafer W is etching-processed by the above-described plasma process system.

The wafer W is attracted and held by the electrostatic chuck 203 and the chamber 201 is kept airtight and exhausted. High frequency voltage is added to the lower electrode 202 while $CHF_3$ gas is introduced into the chamber 201. Plasma is thus generated between the upper 202 and the lower electrode 204. When electrons in plasma are injected, prior to ions, into the lower electrode 204, the lower electrode 204 is self-biased negative and potential (vdc) is caused between the lower electrode 204 and plasma. Ions in plasma are thus strongly pulled to the side of the lower electrode 204 and struck against the wafer W. The etching of the wafer W is advanced in this manner by these ions.

At the same time, the permanent magnet 218 is rotated to add rotating magnetic field between the lower 202 and the upper electrode 204. E×B drift of secondary electrons is caused due to this rotating magnetic field and that electric field between the lower 202 and the upper electrode 204 which is perpendicular to the rotating magnetic field, and the dissociation of ions in plasma is advanced by these electrons. As the result, gas plasma which contributes to the etching of the wafer W is made high in density.

The rim portion of the upper electrode 204 is firmly insulated by the insulator 210. Therefore, the strength of electric field becomes low at the rim portion of the wafer w and the difference of potentials (Vdc) becomes small there. The non-uniformity of plasma is thus reduced and the charging-up of the rim portion of the wafer W is prevented. As the result, the difference of potentials between gate electrodes is reduced at the rim portion of the wafer W and the dielectric breakdown of gate oxide film is prevented.

According to the above-described sixth embodiment of the present invention, the difference of potentials (Vdc) can be made small at the rim portion of the wafer W and the charging-up can be prevented there. This enables the dielectric breakdown (or charge-up damage) of gate oxide film to be prevented.

Figure 11:
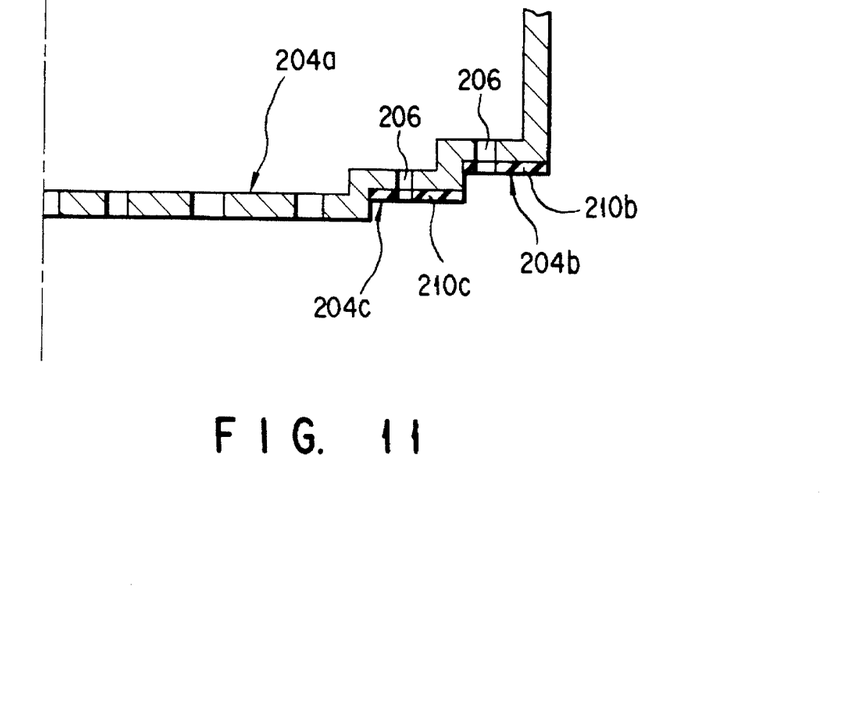
FIG. 11 is a sectional view showing a part of the upper electrode in the plasma process system enlarged.

As shown in FIG. 11, the underside of an upper electrode 204a may be formed like a step at the rim portion thereof. Its inner step 204c is recessed more backwards relative to the wafer W on the lower electrode 202 than its center portion and its outer step 204b is recessed more backwards than its inner one 204c. The outer step 204b is covered by an insulating ring 210b and the inner step 204c by an insulating ring 210c. This rim portion underside of the upper electrode 204a is separated remoter from the lower electrode 202. Therefore, electric field generated here becomes weaker and the charging-up of the wafer rim portion is reduced to a further extent.

Figure 12:
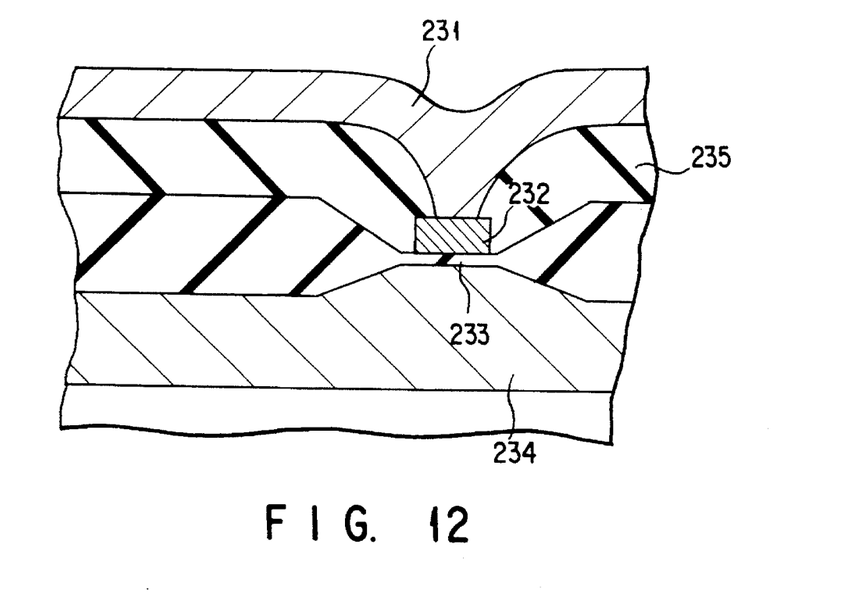
FIG. 12 is a sectional view showing the main portion of a test device enlarged, said test device being used to check the dielectric breakdown of gate oxide film.

Referring to FIG. 12, the dielectric breakdown test of gate oxide film will be described in the case of a 6-inch test device (or antenna MOS capacitor).

As shown in FIG. 12, an antenna 231 of the antenna MOS capacitor is made of polysilicon which tends to collect plasma, and a gate electrode 232 made of polysilicon is connected to this antenna 231. The gate electrode 232 is connected to gate or silicon oxide film 233. Gate oxide film 233 is formed on a silicon substrate 234. An insulating layer 235 which is silicon oxide film is formed between the antenna 231 and gate oxide film 233.

Using the above-described plasma process system (shown in FIG. 10), a test was conducted under the following conditions to check whether or not the gate oxide film of the 6-inch test device (or antenna MOS capacitor) is dielectrically broken down.

1. Plasma processing conditions
   1) Process gas: $CHF_3$ and CO
   2) Gas flow rate
      $CHF_3$: 45 SCCM
      CO: 155 SCCM
   3) Process pressure: 40 mTorr
   4) High frequency power: 1000 W
   5) Permanent magnet
      Magnetic force: 120 G
      Rotation number: 20 rpm
   6) Insulator: Resin of the polyimide group (its thicknesses are shown in Table 1)
2. Test device
   1) Antenna rate: Four hundred thousand (antenna rate= antenna area/gate area in this case)
   2) Gate oxide film thickness: 10 nm Test results are shown in Table 1. The largest potential differences ΔV shown in Table 1 are those obtained between charge-up voltages of each gate electrode at the rim portion of the test device. In sample Nos. 1 to 3, the whole underside of the upper electrode 204 was covered by the insulator 210. In sample Nos. 4 to 7, the insulator 210 was made 0.5 mm thick and its inner diameter was set to be 75 mm, 110 mm, 150 mm and 220 mm. In sample No. 8, its inner diameter was made 150 mm (substantially equal to that of the test device) and its thickness 1 mm.

TABLE 1

| Sample | | Insulator Thickness (mm) | Inner Diameter (mm) | Largest Potential Difference (ΔV) | Breakdown Rate (%) |
| --- | --- | --- | --- | --- | --- |
| Comparison Example | No. 1 | 0.05 | 0 | 40 | 5 |
| Comparison Example | No. 2 | 0.50 | 0 | 38 | 5 |
| Comparison Example | No. 3 | 1.00 | 0 | 37 | 5 |
| Our Example | No. 4 | 0.05 | 75 | 38 | 5 |
| Our Example | No. 5 | 0.50 | 110 | 36 | 5 |
| Our Example | No. 6 | 0.50 | 150 | 35 | 5 |
| Our Example | No. 7 | 0.50 | 220 | 36 | 5 |
| Our Example | No. 8 | 1.00 | 150 | 31 | 2 |

As apparent from Table 1, potential differences in the wafer at the gate electrode 232 were made small and the amount of electrons flowing from the wafer substrate 234 was reduced in sample Nos. 1 to 3. Dielectric breakdown was not caused and the dielectric breakdown rate of gate oxide film 233 was 5%. To add more, the conventional dielectric breakdown rate is 10%.

In sample Nos. 4 to 7, the dielectric breakdown rate was 5%, as seen in sample Nos. 1 to 3. In sample No. 8, the difference of charge-up voltages was reduced to a further extent and the dielectric breakdown rate of gate oxide film 233 was 2%. It has been found from these test results that a more effective merit can be attained when the rim portion underside of the upper electrode 204 is covered by the insulator 210 which is 1 mm or more thick. In this case, however, the center portion underside of the upper electrode 204 which has a diameter substantially equal to that of the wafer W is not covered by the insulator 210.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma process system comprising:

a process chamber in which a gas plasma created under vacuum acts on a substrate;

a load lock chamber located adjacent to the process chamber;

gate valve means for communicating and shielding the load lock chamber with and from the process chamber;

carrier means for carrying the substrate into and out of the load lock chamber;

exhaust means for exhausting said load lock chamber to lower the inner pressure of the load lock chamber to a level substantially equal to the inner pressure of the process chamber; and gas introducing means, arranged in an upper portion within the load lock chamber and provided with a porous member, for introducing gas into the load lock chamber through said porous member;

wherein a gas is blown substantially uniformly from above onto the substrate surface through said porous member.

2. The plasma process system according to claim 1, wherein said porous member is made of a ceramic material.

3. The plasma process system according to claim 1, wherein said porous member is made of a metal.

4. The plasma process system according to claim 1, wherein said porous member has pores with an average pore diameter of about 0.2 μm.

5. The plasma process system according to claim 1, wherein said porous member has a porosity of 10 to 50%.

6. The plasma process system according to claim 1, wherein an exhaust passage communicating with said exhaust means is open in a lower portion of said load lock chamber.

* * * * *